(12) United States Patent
Bouvier et al.

(10) Patent No.: US 9,960,205 B2
(45) Date of Patent: May 1, 2018

(54) OPTOELECTRONIC DEVICE COMPRISING LIGHT-EMITTING DIODES

(71) Applicant: Aledia, Grenoble (FR)

(72) Inventors: Christophe Bouvier, Grenoble (FR); Erwan Dornel, Fontaine (FR)

(73) Assignee: Aledia, Grenoble (FR)

( * ) Notice: Subject to any disclaimer, the term of this patent is extended or adjusted under 35 U.S.C. 154(b) by 0 days. days.

(21) Appl. No.: 15/022,912

(22) PCT Filed: Sep. 30, 2014

(86) PCT No.: PCT/FR2014/052473
§ 371 (c)(1),
(2) Date: Mar. 17, 2016

(87) PCT Pub. No.: WO2015/044621
PCT Pub. Date: Apr. 2, 2015

(65) Prior Publication Data
US 2016/0300881 A1 Oct. 13, 2016

(30) Foreign Application Priority Data

Sep. 30, 2013 (FR) .................................... 13 59409

(51) Int. Cl.
*H01L 33/02* (2010.01)
*H01L 27/15* (2006.01)
(Continued)

(52) U.S. Cl.
CPC .......... *H01L 27/156* (2013.01); *H01L 27/153* (2013.01); *H01L 33/025* (2013.01);
(Continued)

(58) Field of Classification Search
CPC ....... H01L 33/06; H01L 27/153; H01L 33/18; H01L 33/24; H01L 33/62; H01L 33/38;
(Continued)

(56) References Cited

U.S. PATENT DOCUMENTS

| 5,130,761 A * | 7/1992 | Tanaka .................. F21S 48/215 257/100 |
| 2006/0163596 A1* | 7/2006 | Kim .................. G02F 1/133603 257/98 |

(Continued)

FOREIGN PATENT DOCUMENTS

EP 2357676 A1 8/2011

OTHER PUBLICATIONS

Written Opinion, dated Jun. 10, 2015 from corresponding International Application No. PCT/FR2014/052473.

(Continued)

*Primary Examiner* — Evan Pert
*Assistant Examiner* — Changhyun Yi
(74) *Attorney, Agent, or Firm* — Wolf, Greenfield & Sacks, P.C.

(57) ABSTRACT

An optoelectronic device including a semiconductor substrate including first and second opposing faces, a first set of first light-emitting diodes resting on a first portion of the substrate and including conical or frustoconical wire-like semiconductor elements, a first electrode covering each first light-emitting diode, a first conductive portion insulated from the substrate, extending through the substrate and connected to the first electrode; a second set of second light-emitting diodes resting on a second portion of the substrate and including conical or frustoconical wire-like semiconductor elements, a second electrode covering each second light-emitting diode, a second conductive portion insulated from the substrate and connected to the second electrode, and a first conductive element connecting the first conductive portion to the second portion of the substrate on the side of the second face.

16 Claims, 6 Drawing Sheets

(51) Int. Cl.
  *H01L 33/62* (2010.01)
  *H01L 33/44* (2010.01)
  *H01L 33/24* (2010.01)
  *H01L 33/38* (2010.01)
  *H01L 33/08* (2010.01)
(52) U.S. Cl.
  CPC .............. *H01L 33/24* (2013.01); *H01L 33/38* (2013.01); *H01L 33/44* (2013.01); *H01L 33/62* (2013.01); *H01L 33/08* (2013.01); *H01L 2933/0025* (2013.01); *H01L 2933/0066* (2013.01)
(58) Field of Classification Search
  CPC ........... H01L 2933/0066; H01L 27/156; H01L 33/025; H01L 33/08; H01L 33/44; H01L 2933/0025
  USPC .............. 257/13, E33.048, E33.008; 438/47; 345/204
  See application file for complete search history.

(56) References Cited

U.S. PATENT DOCUMENTS

| | | | |
|---|---|---|---|
| 2009/0057693 A1* | 3/2009 | Takeuchi | H01L 27/153 257/93 |
| 2010/0051972 A1* | 3/2010 | Chen | H01L 25/0753 257/88 |
| 2011/0204327 A1* | 8/2011 | Hiruma | H01L 27/153 257/13 |
| 2011/0309354 A1* | 12/2011 | Wang | H01L 21/02472 257/43 |
| 2012/0205614 A1 | 8/2012 | Templier et al. | |

OTHER PUBLICATIONS

International Search Report, dated Jun. 10, 2015, from corresponding International Application No. PCT/FR2014/052473.

* cited by examiner

OPTOELECTRONIC DEVICE COMPRISING LIGHT-EMITTING DIODES

The present patent application claims the priority benefit of French patent application FR13/59409 which is herein incorporated by reference.

BACKGROUND

The present invention generally relates to optoelectronic devices based on semiconductor materials and to methods for manufacturing the same. The present invention more specifically relates to optoelectronic devices comprising light-emitting diodes formed by three-dimensional elements, particularly semiconductor microwires or nanowires.

DISCUSSION OF THE RELATED ART

The phrase "optoelectronic devices with light-emitting diodes" designates devices capable of converting an electric signal into an electromagnetic radiation, and particularly devices dedicated to emitting an electromagnetic radiation, particularly light. Examples of three-dimensional elements capable of forming light-emitting diodes are microwires or nanowires comprising a semiconductor material based on a compound mainly comprising at least one group-III element and one group-V element (for example, gallium nitride GaN), called III-V compound hereafter, or mainly comprising at least one group-II element and one group-VI element (for example, zinc oxide ZnO), called II-VI compound hereafter.

The three-dimensional elements, particularly semiconductor microwires or nanowires, of a plurality of optoelectronic devices may be formed on a substrate which is then sawn to delimit individual optoelectronic devices. Each optoelectronic device is then arranged in a package, particularly to protect the three-dimensional elements, and the package is attached to a support, for example, a printed circuit.

It may be desirable to connect light-emitting diodes in series. For this purpose, the light-emitting diodes are formed on a plurality of separate optoelectronic devices and the optoelectronic devices are attached to the support and series-connected to one another. The total bulk of the obtained optoelectronic system may be significant. The method of manufacturing the electronic system comprising the series-connected optoelectronic devices then comprises, in addition to the steps of manufacturing each optoelectronic device, different steps of attaching the optoelectronic devices to the support and steps of connecting the optoelectronic devices to one another. These steps increase the manufacturing cost of the optoelectronic system.

SUMMARY

Thus, an object of an embodiment is to overcome at least part of the disadvantages of previously-described optoelectronic devices with light-emitting diodes, particularly with microwires or nanowires, and of their manufacturing methods.

Another object of an embodiment is to decrease the bulk of an optoelectronic system comprising series-connected light-emitting diodes.

Another object of an embodiment is to decrease the number of steps of the method of manufacturing an optoelectronic device comprising series-connected light-emitting diodes.

Another object of an embodiment is for optoelectronic devices with light-emitting diodes to be capable of being manufactured at an industrial scale and at a low cost.

Thus, an embodiment provides an optoelectronic device comprising:

a doped semiconductor substrate of a first conductivity type, the substrate comprising first and second opposite surfaces;

a first assembly of first light-emitting diodes supported by a first portion of the substrate and comprising first wire-shaped, conical, or frustoconical semiconductor elements;

a first electrode, at least partially transparent, covering each first light-emitting diode;

a first conductive portion insulated from the substrate and crossing the substrate from the second surface to at least the first surface and connected to the first electrode;

a second assembly of second light-emitting diodes supported by a second portion of the substrate and comprising second wire-shaped, conical, or frustoconical semiconductor elements;

a second electrode, at least partially transparent, covering each second light-emitting diode;

a second conductive portion insulated from the substrate and crossing the substrate from the second surface to at least the first surface and connected to the second electrode; and a first conductive element, connecting on the second surface side the first conductive portion to the second substrate portion.

According to an embodiment, the first substrate portion is insulated from the second substrate portion by the first insulated conductive portion.

According to an embodiment, the device comprises first and second opposite lateral edges and the first insulated conductive portion extends from the first to the second lateral edge.

According to an embodiment, the first insulated conductive portion surrounds the first substrate portion.

According to an embodiment, the device comprises an insulating portion, different from the first insulated conductive portion and insulating the first substrate portion from the second substrate portion.

According to an embodiment, the device comprises first and second opposite lateral edges and the insulating portion extends from the first to the second lateral edge.

According to an embodiment, the first insulating portion surrounds the first substrate portion.

According to an embodiment, the device comprises a first conductive pad on the second surface in contact with the first substrate portion.

According to an embodiment, the substrate is selected from the group comprising silicon, germanium, silicon carbide, and III-V compounds.

According to an embodiment, the dopant concentration of the substrate is in the range from $5*10^{16}$ to $2*10^{20}$ atoms/$cm^3$.

According to an embodiment, the light-emitting diodes of the first assembly are capable of emitting light at a first wavelength and the light-emitting diodes of the second assembly are capable of emitting light at a second wavelength different from the first wavelength.

According to an embodiment, the device further comprises:

a third assembly of third light-emitting diodes supported by a third portion of the substrate and comprising third wire-shaped, conical, or frustoconical semiconductor elements;

a third electrode, at least partially transparent, covering each third light-emitting diode;

a third conductive portion insulated from the substrate and crossing the substrate from the second surface to at least the first surface and connected to the third electrode; and a second conductive element, connecting on the second surface side the second conductive portion to the third substrate portion.

According to an embodiment, the light-emitting diodes of the third assembly are capable of emitting light at a third wavelength different from the first and second wavelengths.

According to an embodiment, the surfaces of the first, second, and third assemblies are selected so that the composition of the light at the first, second, and third emitted wavelengths corresponds to an emitted white light.

According to an embodiment, one of the first, second, or third wavelengths corresponds to blue light, another one of the first, second, or third wavelengths corresponds to green light, and another one of the first, second, or third wavelengths corresponds to red light.

According to an embodiment, the device comprises from four to more than one hundred assemblies of light-emitting diodes series-connected by conductive portions insulated from the substrate and crossing the substrate from the second surface to at least the first surface.

An embodiment also provides a method of manufacturing an optoelectronic device, comprising the steps of:

(a) providing a doped substrate of a first conductivity type, the substrate comprising a first surface;

(b) forming, on the first surface, a first assembly of first light-emitting diodes supported by a first portion of the substrate and comprising first wire-shaped, conical, or frustoconical semiconductor elements and a second assembly of second light-emitting diodes supported by a second portion of the substrate and comprising second wire-shaped, conical, or frustoconical semiconductor elements;

(c) forming a first electrode, at least partially transparent, covering each first light-emitting diode and a second electrode, at least partially transparent, covering each second light-emitting diode;

(d) covering the entire first surface of a layer encapsulating the first and second light-emitting diodes;

(e) decreasing the substrate thickness;

(f) forming a first conductive portion insulated from the substrate and crossing the substrate from a second surface of the substrate, opposite to the first surface, to at least the first surface and connected to the first electrode and a second conductive portion insulated from the substrate and crossing the substrate from the second surface to at least the first surface and connected to the second electrode; and (g) forming a conductive element, connecting on the second surface side the first conductive portion to the second substrate portion.

According to an embodiment, steps (a) to (g) are successive.

According to an embodiment, step (f) is carried out before step (b).

According to an embodiment, step (f) is carried out between steps (b) and (c).

According to an embodiment, step (f) successively comprises etching first openings in the substrate from the second surface, forming an insulating layer at least on the lateral walls of the first openings, and forming a conductive layer covering the insulating layer, or filling the first openings with a conductive material.

According to an embodiment, step (f) comprises, before step (b) or between steps (b) and (c), etching second openings in the substrate from the first surface across part of the substrate thickness, the second openings being open on the second surface after the step of thinning the substrate.

According to an embodiment, the first electrode is further formed in one of the second openings and the second electrode is further formed in another one of the second openings.

According to an embodiment, the method comprises, before step (b), forming an insulating portion at least on the lateral walls of the second openings and filling the second openings with a filling material.

According to an embodiment, the filling material is identical to the material forming the substrate.

According to an embodiment, the filling material is an in-situ doped semiconductor material.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for controlling the optoelectronic device described hereafter are within the abilities of those skilled in the art and are not described.

In the following description, unless otherwise indicated, terms "substantially", "approximately", and "in the order of" mean "to within 10%". Further, "compound mainly formed of a material" or "compound based on a material" means that a compound comprises a proportion greater than or equal to 95% of said material, this proportion being preferably greater than 99%.

The present description relates to optoelectronic devices comprising three-dimensional elements, for example, microwires, nanowires, conical elements, or frustoconical elements. In the following description, embodiments are described for optoelectronic devices comprising microwires or nanowires. However, these embodiments may be implemented for three-dimensional elements other than microwires or nanowires, for example, pyramid-shaped three-dimensional elements.

Term "microwire" or "nanowire" designates a three-dimensional structure having an elongated shape along a preferred direction, having at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest minor dimension. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter.

According to an embodiment, an optoelectronic device comprising at least two assemblies of light-emitting diodes is provided, the light-emitting diodes of each assembly between assembled in parallel so that the assembly of light-emitting diodes is equivalent to a general light-emitting diode. The two general light-emitting diodes are series-connected. To form such a series assembly, through silicon vias or TSVs are formed in the semiconductor substrate having the light-emitting diodes formed thereon.

Figure 1:
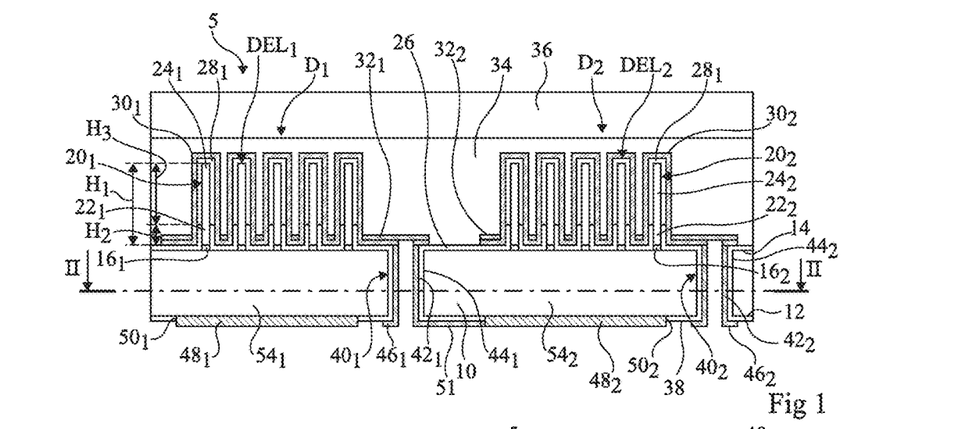
FIG. 1 is a partial simplified cross-section view of an embodiment of an optoelectronic device with microwires or nanowires manufactured on a semiconductor substrate.

FIG. 1 is a partial simplified cross-section view of an embodiment of an optoelectronic device 5 comprising light-emitting diodes formed from wires such as described hereabove.

The optoelectronic device comprises two assemblies $D_1$ and $D_2$ of light-emitting diodes. In the following description, index "1" or "2" is added to a reference to designate an element respectively associated with assembly $D_1$ or $D_2$.

FIG. 1 shows a structure comprising:

a semiconductor substrate 10 comprising a lower surface 12 and an opposite upper surface 14, upper surface 14 being preferably planar at least at the level of the light-emitting diodes;

seed pads $16_1$, $16_2$ favoring the growth of wires and arranged on surface 14;

wires $20_1$, $20_2$ distributed in at least two assemblies $D_1$ and $D_2$ of wires (two assemblies of five wires being shown as an example) having a height $H_1$, each wire $20_1$, $20_2$ being in contact with one of seed pads $16_1$, $16_2$, each wire $20_1$, $20_2$ comprising a lower portion $22_1$, $22_2$, of height $H_2$, in contact with seed pad $16_1$, $16_2$ and an upper portion $24_1$, $24_2$, of height $H_3$, extending lower portion $22_1$, $22_2$;

an insulating layer 26 extending on surface 14 of substrate 10 and on the lateral sides of lower portion $22_1$, $22_2$ of each wire $20_1$, $20_2$;

a shell $28_1$, $28_2$ comprising a stack of semiconductor layers covering each upper portion $24_1$, $24_2$;

for each assembly $D_1$, $D_2$, a layer $30_1$, $30_2$ forming an electrode covering each shell $28_1$, $28_2$ and further extending on insulating layer 26;

for each assembly $D_1$, $D_2$, a conductive layer $32_1$, $32_2$ covering electrode layer $30_1$, $30_2$ between wires $20_1$, $20_2$ without extending on wires $20_1$, $20_2$;

an encapsulation layer 34 covering the entire structure and particularly each electrode layer $30_1$, $30_2$;

an additional support 36, also called handle;

an insulating layer 38 covering lower surface 12;

for each assembly $D_1$, $D_2$, a TSV $40_1$, $40_2$, each TSV $40_1$, $40_2$ comprising a conductive portion $42_1$, $42_2$ which is connected to electrode $30_1$, $30_2$, which extends in substrate 10 from upper surface 14 to lower surface 12 and which is insulated from substrate 10 by an insulating layer $44_1$, $44_2$, conductive portion $42_1$, $42_2$ continuing on insulating layer 38 in a conductive pad $46_1$, $46_2$; and conductive pads $48_1$, $48_2$ in contact with lower surface 12 through openings $50_1$, $50_2$ provided in insulating layer 38, each conductive pad $48_1$, $48_2$ being substantially arranged under the associated wires $20_1$, $20_2$, conductive pad $48_2$ being connected to conductive edge $46_1$ by a conductive portion 51.

In the embodiment shown in FIG. 1, each conductive portion $42_1$, $42_2$ may correspond to a layer or to a stack of layers covering insulating layer $44_1$, $44_2$. The core of TSV $40_1$, $40_2$ may be totally or only partially filled with a conductive material.

Optoelectronic device 5 may further comprise a phosphor layer, not shown, confounded with encapsulation layer 34, or provided between encapsulation layer 34 and handle 36 or provided on handle 36.

The assembly formed by each wire $20_1$, $20_2$, the associated seed pad $16_1$, $16_2$, and shell $28_1$, $28_2$ forms a light-emitting diode $DEL_1$, $DEL_2$. The base of diode $DEL_1$, $DEL_2$ corresponds to seed pad $16_1$, $16_2$.

Light-emitting diodes $DEL_1$ are connected in parallel so that assembly $D_1$ of light-emitting diodes is equivalent to a general light-emitting diode. Light-emitting diodes $DEL_2$ are connected in parallel so that assembly $D_2$ of light-emitting diodes is equivalent to a general light-emitting diode. Each assembly $D_1$ and $D_2$ may comprise from a few light-emitting diodes $DEL_1$, $DEL_2$ to some thousand light-emitting diodes.

In the present embodiment, semiconductor substrate 10 corresponds to a monolithic structure. Semiconductor substrate 10 for example is a substrate made of silicon, of germanium, of silicon carbide, of a III-V compound, such as GaN or GaAs, or a ZnO substrate. Preferably, substrate 10 is a single-crystal silicon substrate.

Preferably, semiconductor substrate 10 is doped to lower the electric resistivity down to a resistivity close to that of metals, preferably smaller than a few mohm·cm. Substrate 10 preferably is a heavily-doped substrate with a dopant concentration in the range from $5*10^{16}$ atoms/cm$^3$ to $2*10^{20}$ atoms/cm$^3$, preferably from $1*10^{19}$ atoms/cm$^3$ to $2*10^{20}$ atoms/cm$^3$, for example $5*10^{19}$ atoms/cm$^3$. Substrate 10 has a thickness in the range from 275 µm to 1,500 mm, preferably 725 µm. In the case of a silicon substrate 10, examples of P-type dopants are boron (B) or indium (In) and examples of N-type dopants are phosphorus (P), arsenic (As), or antimony (Sb). Preferably, substrate 10 is N-type phosphorus-doped. Surface 12 of silicon substrate 10 may be a <100> surface.

Seed pads $16_1$, $16_2$, also called seed islands, are made of a material favoring the growth of wires $20_1$, $20_2$. A treatment may be provided to protect the lateral sides of the seed pads and the surface of the substrate portions which are not covered with the seed pads to prevent the wires from growing on the lateral sides of the seed pads and on the surface of the substrate portions which are not covered with the seed pads. The treatment may comprise forming a dielectric region on the lateral sides of the seed pads and extending on top of and/or inside of the substrate and connecting, for each pair of pads, one of the pads of the pair to the other pad in the pair, with no wire growth on the dielectric region. Said dielectric region may further extend above seed pads $16_1$, $16_2$. As a variation, seed pads $16_1$, $16_2$ may be replaced with a seed layer covering surface 14 of substrate 10 in the area associated with assembly $D_1$ or $D_2$. A dielectric region may then be formed above the seed layer to prevent the growth of wires in unwanted locations.

As an example, the material forming seed pads $16_1$, $16_2$ may be a nitride, a carbide, or a boride of a transition metal from column IV, V, or VI of the periodic table of elements or a combination of these compounds. As an example, seed pads $16_1$, $16_2$ may be made of aluminum nitride (AlN), boron (B), boron nitride (BN), titanium (Ti), titanium nitride (TiN), tantalum (Ta), tantalum nitride (TaN), hafnium (Hf), hafnium nitride (HfN), niobium (Nb), niobium nitride (NbN), zirconium (Zr), zirconium borate (ZrB$_2$), zirconium nitride (ZrN), silicon carbide (SiC), tantalum carbo-nitride (TaCN), magnesium nitride in $Mg_xN_y$ form, where x is approximately equal to 3 and y is approximately equal to 2, for example, magnesium nitride in $Mg_3N_2$ form or magnesium gallium nitride (MgGaN), tungsten (W), tungsten nitride (WN), or a combination thereof.

Seed pads $16_1$, $16_2$ may be doped with the same conductivity type as substrate 10. Insulating layer 26 may be made of a dielectric material, for example, of silicon oxide (SiO$_2$), of silicon nitride (Si$_x$N$_y$, where x is approximately equal to 3 and y is approximately equal to 4, for example, Si$_3$N$_4$), of silicon oxynitride (SiO$_x$N$_y$, where x may be approximately equal to ½ and y may be approximately equal to 1, for example, Si$_2$ON$_2$), of aluminum oxide (Al$_2$O$_3$), of hafnium oxide (HfO$_2$), or of diamond. As an example, the thickness of insulating layer 26 is in the range from 5 nm to 800 nm, for example, equal to approximately 30 nm.

Wires $20_1$, $20_2$ are at least partly formed based on at least one semiconductor material. The semiconductor material may be silicon, germanium, silicon carbide, a III-V compound, a II-VI compound, or a combination of these compounds.

Wires $20_1$, $20_2$ may be at least partly formed of semiconductor materials mainly comprising a III-V compound, for example, III-N compounds. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions.

Wires $20_1$, $20_2$ may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

Wires $20_1$, $20_2$ may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

The cross-section of wires $20_1$, $20_2$ may have different shapes, such as, for example, oval, circular, or polygonal, particularly triangular, rectangular, square, or hexagonal. It should thus be understood that term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section. The average diameter of each wire $20_1$, $20_2$ may be in the range from 50 nm to 2.5 µm. Height $H_1$ of each wire $20_1$, $20_2$ may be in the range from 250 nm to 50 µm. Each wire $20_1$, $20_2$ may have an elongated semiconductor structure along an axis substantially perpendicular to surface 14. Each wire $20_1$, $20_2$ may have a general cylindrical shape. The axes of two wires 20 may be distant by from 0.5 µm to 10 µm, and preferably from 1.5 µm to 4 µm. As an example, wires $20_1$, $20_2$ may be regularly distributed, particularly in a hexagonal network.

As an example, lower portion $22_1$, $22_2$ of each wire $20_1$, $20_2$ is mainly formed of the III-N compound, for example, gallium nitride, of same doping type as substrate 10, for example, type N, for example, silicon-doped. Lower portion $22_1$, $22_2$ extends up to a height $H_2$ which may be in the range from 100 nm to 25 µm.

As an example, upper portion $24_1$, $24_2$ of each wire $20_1$, $20_2$ is at least partially made of a III-N compound, for example, GaN. Upper portion $24_1$, $24_2$ may be N-type doped, possibly less heavily doped than lower portion $22_1$, $22_2$, or may not be intentionally doped. Upper portion $24_1$, $24_2$ extends up to a height $H_3$ which may be in the range from 100 nm to 25 µm.

Shell $28_1$, $28_2$ may comprise a stack of a plurality of layers, particularly comprising:
- an active layer covering upper portion $24_1$, $24_2$ of the associated wire $20_1$, $20_2$;
- an intermediate layer having a conductivity type opposite to that of lower portion $22_1$, $22_2$ covering the active layer; and
- a connection layer covering the intermediate layer and covered with electrode $30_1$, $30_2$.

The active layer is the layer from which most of the radiation delivered by light-emitting diode $DEL_1$, $DEL_2$ is emitted. According to an example, the active layer may comprise confinement means, such as multiple quantum wells. It is for example formed of an alternation of GaN and of InGaN layers having respective thicknesses from 5 to 20 nm (for example, 8 nm) and from 1 to 10 nm (for example, 2.5 nm). The GaN layers may be doped, for example of type N or P. According to another example, the active layer may comprise a single InGaN layer, for example, having a thickness greater than 10 nm.

The intermediate layer, for example, P-type doped, may correspond to a semiconductor layer or to a stack of semiconductor layers and allows the forming of a P-N or P-I-N junction, the active layer being comprised between the intermediate P-type layer and upper N-type portion $24_1$, $24_2$ of the P-N or P-I-N junction.

The bonding layer may correspond to a semiconductor layer or to a stack of semiconductor layers and enables to form an ohmic contact between the intermediate layer and electrode $30_1$, $30_2$. As an example, the bonding layer may be very heavily doped, of a type opposite to that of lower portion $22_1$, $22_2$ of each wire 20, until degeneration of the semiconductor layer(s), for example, P-type doped at a concentration greater than or equal to $10^{20}$ atoms/cm$^3$.

The stack of semiconductor layers may comprise an electron barrier layer formed of a ternary alloy, for example, made of aluminum gallium nitride (AlGaN) or of aluminum indium nitride (AlInN) in contact with the active layer and the intermediate layer, to provide a good distribution of electric carriers in the active layer.

Electrode $30_1$, $30_2$ is capable of biasing the active layer of each wire $20_1$, $20_2$ and of letting through the electromagnetic radiation emitted by light-emitting diodes $DEL_1$, $DEL_2$. The material forming electrode $30_1$, $30_2$ may be a transparent and conductive material such as indium tin oxide (ITO), aluminum zinc oxide, or graphene. As an example, electrode layer $30_1$, $30_2$ has a thickness in the range from 5 nm to 200 nm, preferably from 20 nm to 50 nm.

Conductive layer $32_1$, $32_2$ preferably corresponds to a metal layer, for example, aluminum, silver, copper, or zinc. As an example, conductive layer $32_1$, $32_2$ has a thickness in the range from 20 nm to 1,000 nm, preferably from 100 nm to 200 nm.

Encapsulation layer 34 is made of an at least partially transparent insulating material. The minimum thickness of encapsulation layer 34 is in the range from 250 nm to 50 μm so that encapsulation layer 34 fully covers electrode $30_1$, $30_2$ at the top of light-emitting diodes $DEL_1$, $DEL_2$. Encapsulation layer 34 may be made of an at least partially transparent inorganic material. As an example, the inorganic material is selected from the group comprising silicon oxides, of type $SiO_x$, where x is a real number between 1 and 2, or $SiO_yN_z$ where y and z are real numbers between 0 and 1, and aluminum oxides, for example, $Al_2O_3$. Encapsulation layer 34 may be made of an at least partially transparent organic material. As an example, encapsulation layer 34 is a silicone polymer, an epoxide polymer, an acrylic polymer, or a polycarbonate.

As an example, handle 36 has a thickness ranging from 200 μm to 1,000 μm. Handle 36 is made of an at least partly transparent material. It may be glass, particularly a borosilicate glass, for example, Pyrex, or sapphire.

According to another embodiment, handle 36 is not present.

The biasing of general light-emitting diodes $D_1$ and $D_2$ is obtained by connecting conductive pad $48_1$ to a source of a first reference potential and by connecting conductive pad $46_2$ to a source of a second reference potential. As an example, in the case of N-type doped wire, the first potential (cathode) may be lower than the second potential (anode) and the source of the first potential may correspond to ground. Such a potential difference is preferably greater than the sum of the threshold voltages of each general light-emitting diode to forward bias the assembly of the two series-connected general light-emitting diodes to allow current to flow. As an example, the potential difference may be in the order of 6 V for two series-connected GaN diodes.

A passivation layer, particularly made of polymer, may be deposited on the structure on the rear surface side, openings being formed in the passivation layer to expose conductive pads $48_1$ and $46_2$. Conductive pads $48_1$ and $46_2$ are used to assemble the optoelectronic component encapsulated on its final support, for example, a printed circuit. The assembly methods may comprise soldering operations. The metal stack is selected to be compatible with solder operations used in electronics, and particularly with the soldering used, for example, in Cu with an organic solderability preservative finish (OSP) or Ni—Au finish (by a process which may be chemical (ENIG, Electroless nickel immersion gold) or electrochemical), Sn, Sn—Ag, Ni—Pd—Au, Sn—Ag—Cu, Ti-Wn-Au, or ENEPIG (Electroless Nickel/Electroless Palladium/Immersion Gold).

Optoelectronic device 5 further comprises means of electric insulation between the portion of substrate 10 which extend between conductive pad $48_1$ and light-emitting diodes $DEL_1$ and the portion of substrate 10 which extends between conductive pad $48_2$ and light-emitting diodes $DEL_2$. According to an embodiment, the insulation is performed by TSV $40_1$.

The active layer of shell $28_1$ may be manufactured identically or not to the active layer of shell $28_2$. For example, the active layer of shell $28_1$ may be adapted to emit light at a first wavelength, for example, blue light, and the active layer of shell $28_2$ may be adapted to emit light at a second wavelength different from the first wavelength, for example, green light. This may be obtained, for example, by adapting the thicknesses or the compositions of the quantum wells forming these active layers. In the case where the active layers of shells $28_1$ and $28_2$ are manufactured in different ways, a first masking step may be provided to protect general light-emitting diode $D_2$ during the forming of the active layer of shell $28_1$ and a second masking layer may be provided to protect general light-emitting diode $D_1$ during the forming of the active portion of shell $28_2$.

As an example, optoelectronic device 5 may comprise a third general light-emitting diode series-connected to general light-emitting diodes $D_1$ and $D_2$. As an example, the third general light-emitting diode may be adapted to emit light at a third wavelength different from the first and second wavelengths, for example, red light. Thus, the composition of the blue, green, and red lights may be selected so that an observer perceives white light by composition of the colors.

Figure 2:
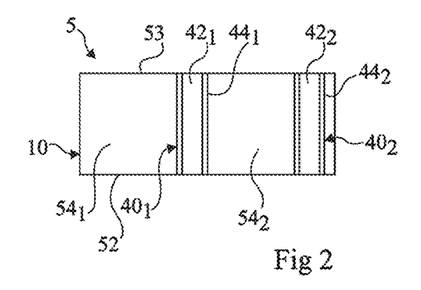
FIGS. 2 and 3 are partial simplified top views illustrating two different layouts of conductive trenches of the device of FIG. 1.

FIG. 2 is a partial simplified cross-section view at a reduced scale of optoelectronic device 5 of FIG. 1 along line II-II. According to an embodiment, optoelectronic device 5 comprises two opposite lateral edges 52, 53 and TSV $40_1$ extends over the entire width of substrate 10, from lateral edge 52 to lateral edge 53, to divide substrate 10 into two substrate portions $54_1$ and $54_2$. TSV $40_1$ electrically insulates substrate portion $54_1$ from substrate portion $54_2$. TSV $40_1$ then corresponds to a trench which extends from lateral edge 52 to lateral edge 53 over a distance which depends on the size of optoelectronic component 5, for example, in the range from 15 μm to 3,000 μm, for example approximately 350 μm. The width of TSV $40_1$, that is, the distance separating the two lateral walls of TSV $40_1$, is in the range from 5 to 200 μm, for example, 50 μm. TSV $40_2$ extends along or close to a lateral edge of substrate portion $54_2$ opposite to TSV $40_1$. The length of substrate portion $54_1$, that is, the distance separating TSV $40_1$ from the lateral edge of substrate portion $54_2$ opposite to TSV $40_1$ may be identical to or different from the length of substrate portion $54_2$, that is, the distance separating TSV $40_1$ from TSV $40_2$. For example, in the case where the active layers of shells $28_1$ and $28_2$ are manufactured to have light emissions of different colors, the lengths of substrate portions $54_1$ and $54_2$ may be adapted to obtain general light-emitting diode surface areas providing a desired color composition. As an example, in the case of three general light-emitting diodes emitting blue, green, and red light, said surface areas may be selected to obtain a white color by color composition.

Figure 3:
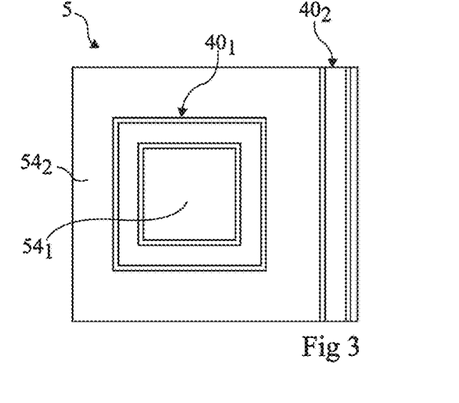

FIG. 3 is a cross-section view similar to FIG. 2 of another embodiment where TSV $40_1$ follows, in the cross-section plane, a closed curve, for example, square as shown in FIG. 3, rectangular, circular, elliptic, etc. TSV $40_1$ surrounds substrate portion $54_1$ and is surrounded with substrate portion $54_2$. TSV $40_2$ may extend along a lateral edge of substrate portion $54_2$. TSV $40_2$ may also follow, in the cross-section plane, a closed curve, for example, square, rectangular, circular, elliptic, etc., concentrically to TSV $40_1$.

As an example, optoelectronic device 5 may comprise more than two series-connected general light-emitting diodes. In this case, each TS V separating a pair of adjacent general light-emitting diodes of the succession of general light-emitting diodes may follow a closed curve concentric to the TSV separating the previous pair of adjacent general light-emitting diodes of the succession of general light-emitting diodes. Optoelectronic device 5 may for example comprise three general light-emitting diodes having their first TSV forming a closed curve, their second TSV forming a closed curve concentric to the first TSV, and their third TSV extending along the lateral edge. As an example, in the case of three general light-emitting diodes emitting blue, green, and red light, said surface areas may be selected to obtain a white color by color composition.

According to another embodiment, the electric insulation between substrate portions $54_1$ and $54_2$ may be achieved by other means than TSVs $40_1$, $40_2$. It may be trenches filled with an insulating material extending across the entire depth of substrate 10 or doped regions of a polarity type opposite to substrate 10 and extending across the entire depth of substrate 10.

Figure 4:
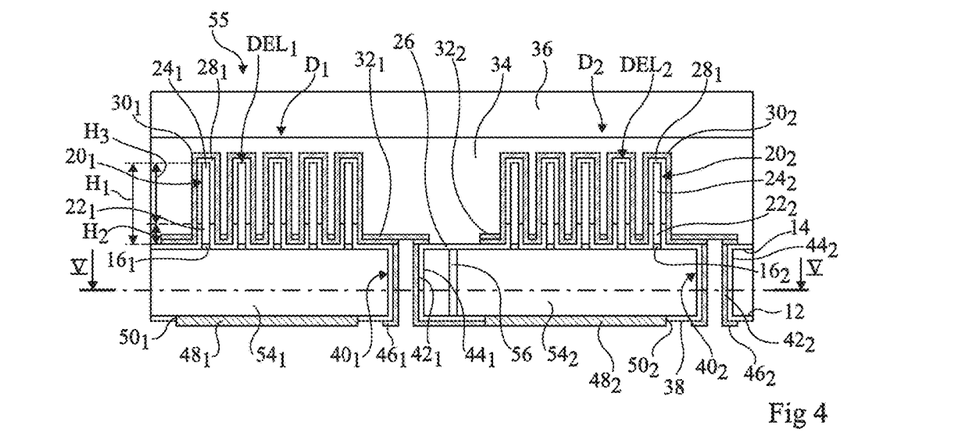
FIG. 4 is a partial simplified cross-section view of another embodiment of an optoelectronic device with microwires or nanowires manufactured on a semiconductor substrate.

FIG. 4 is a view similar to FIG. 1 of another embodiment of an optoelectronic device 55. Optoelectronic device 55 comprises all the elements of optoelectronic device 5 shown in FIG. 1 and further comprises at least one insulating trench 56 extending across the entire thickness of substrate 10 from upper surface 14 to lower surface 12. It may be a trench 56 formed by a deep trench insulation manufacturing method.

Figure 5:
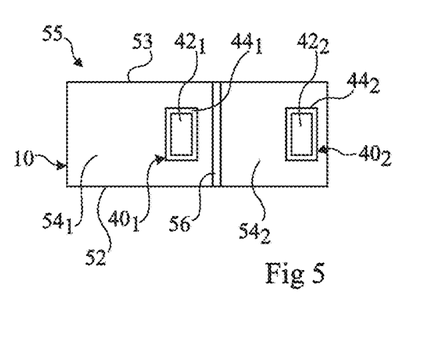
FIGS. 5 and 6 are partial simplified top views illustrating two different layouts of insulating trenches of the device of FIG. 3.

FIG. 5 is a partial simplified cross-section view at a reduced scale of optoelectronic device 55 of FIG. 4 along line V-V. Insulating trench 56 extends over the entire width of substrate 10, from lateral edge 52 to lateral edge 53 and electrically insulates substrate portion $54_1$ from substrate portion $54_2$. Insulating trench 56 extends from lateral edge 52 to lateral edge 53 over a distance which depends on the size of optoelectronic component 55, for example, in the range from 15 µm to 3,000 µm, for example, approximately 350 µm. The width of insulating trench 56, that is, the distance separating the two lateral walls of the insulating trench, is in the range from 1 to 10 µm, for example, 2 µm.

The dimensions of each TSV $40_1$, $40_2$ are adapted to the dimensions of the optoelectronic device. For each general light-emitting diode $D_1$, $D_2$, a plurality of TSVs $40_1$, $40_2$, $100_1$, $100_2$ may be formed simultaneously to create parallel connections. This enables to decrease the resistance of connections. Such connections may be arranged at the periphery of the area where light-emitting diodes DEL are formed in a wire-free area.

Figure 6:
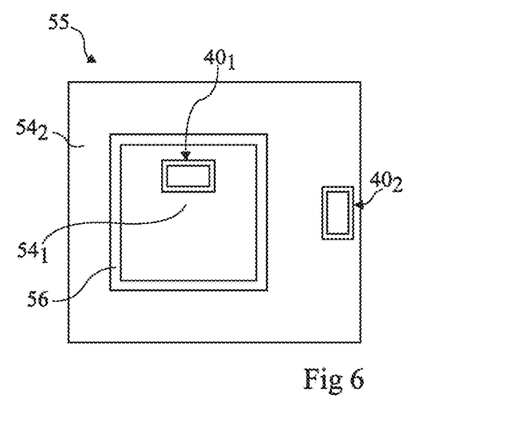

FIG. 6 is a cross-section view similar to FIG. 5 of another embodiment wherein insulating trench 56 follows, in the cross-section plane, a closed curve, for example square as shown in FIG. 6, rectangular, circular, elliptic, etc. Insulating trench 56 surrounds substrate portion $54_1$ and is surrounded with substrate portion $54_2$.

Figure 7:
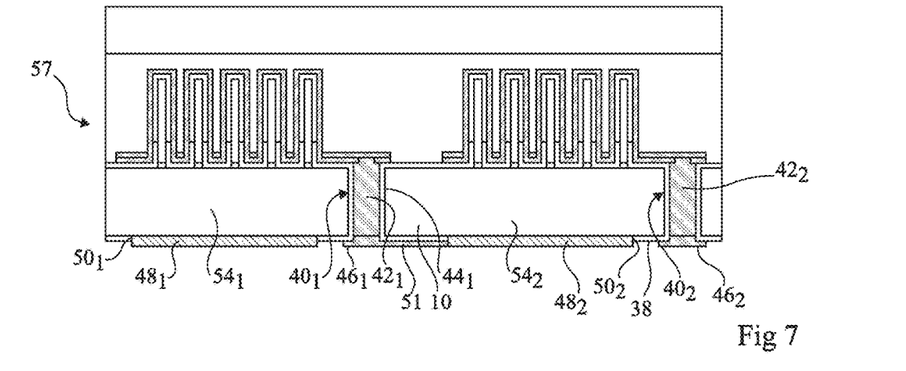
FIGS. 7 to 10 are partial simplified cross-section views of other embodiments of an optoelectronic device having microwires or nanowires manufactured on a semiconductor substrate.

FIG. 7 is a view similar to FIG. 1 of another embodiment of an optoelectronic device 57. Optoelectronic device 57 comprises all the elements of optoelectronic device 5 shown in FIG. 1 with the difference that conductive portion $42_1$, $42_2$ totally fills each TSV $40_1$, $40_2$.

Figure 8:
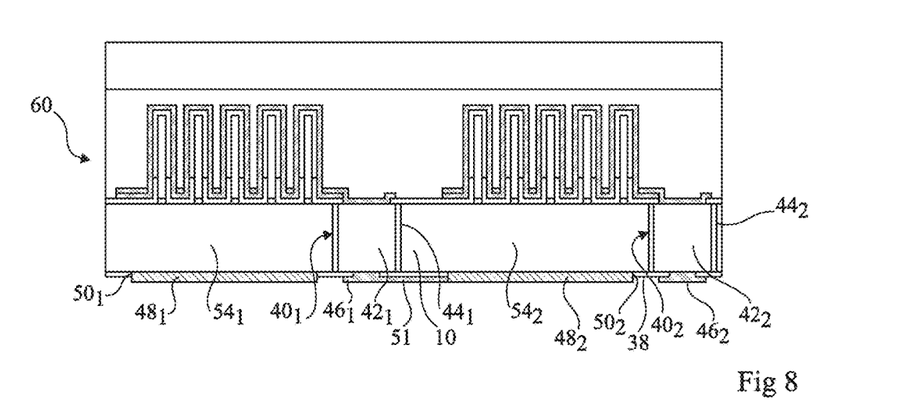

FIG. 8 is a view similar to FIG. 7 of another embodiment of an optoelectronic device 60. Optoelectronic device 60 comprises all the elements of optoelectronic device 5 shown in FIG. 1 with the difference that conductive portion $42_1$, $42_2$ of each TSV $40_1$, $40_2$ corresponds to a portion of substrate 10 which is insulated from the rest of the substrate by insulating layer $44_1$, $44_2$.

Figure 9:
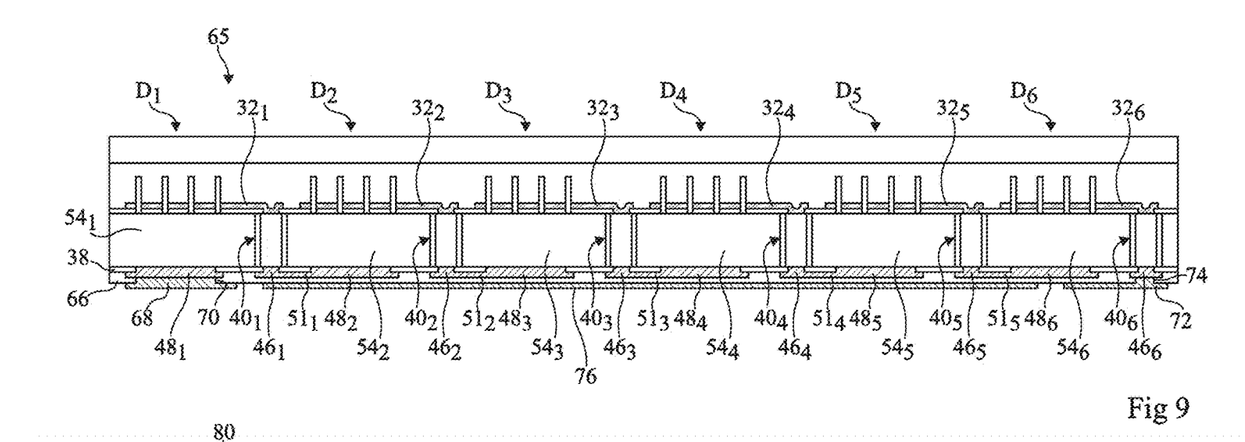

FIG. 9 is a partial simplified cross-section view of an embodiment of an optoelectronic device 65 comprising a succession of a plurality of series-connected general light-emitting diodes. As an example, six general light-emitting diodes $D_1$ to $D_6$ are shown in FIG. 9. In the following description, index "1", "2" ... or "6" is added to a reference to designate an element respectively associated with general light-emitting diode $D_1$, $D_2$ ... or $D_6$. In FIG. 9, the light-emitting diodes are not shown in detail. In particular, the electrode covering the light-emitting diodes is not shown and only conductive layer $32_i$ is shown. Optoelectronic device 65 may comprise from 2 to more than 100 assemblies of series-connected light-emitting diodes. The association of assemblies of series-connected light-emitting diodes enables to increase the maximum amplitude of the power supply voltage applied to the assemblies of light-emitting diodes, which is equal to the difference between the first and second reference voltages. As an example, the power supply voltage may have a maximum amplitude greater than or equal to 6 V, for example, approximately 12 V, 24 V, 48 V, 110 V, or 240 V.

The optoelectronic device is obtained by repeating a plurality of times the structure shown in one of FIG. 1, 7, or 8. Except for the general light-emitting diodes located at the ends of the succession, the anode of each considered general light-emitting diode is connected to the cathode of the general light-emitting diode in the succession which follows the considered general light-emitting diode and the cathode of the considered general light-emitting diode is connected to the anode of the general light-emitting diode in the succession which comes before the considered general light-emitting diode. To achieve this, the conductive pad $48_i$ of each general light-emitting diode $D_i$, for i in the range from 2 to 6, is connected to the conductive pad $46_{i-1}$ of general light-emitting diode $D_{i-1}$ by conductive track $51_{i-1}$ which extends on conductive layer 38. Further, TSV $40_i$ is connected to conductive layer $32_i$ of general light-emitting diode $D_i$. TSVs $40_i$ and $40_{i+1}$ define substrate portion $54_{i+1}$.

As compared with the structures shown in one of FIG. 1, 7, or 8, optoelectronic device 65 further comprises:
  an insulating layer 66 covering insulating layer 38, totally covering conductive pads $46_i$ and $48_i$ of light-emitting diodes $D_i$, where i is in the range from 2 to 5, TSV $40_1$ and conductive pad $48_6$, and partially covering conductive pad $48_1$ and conductive pad $46_6$;
  a conductive pad 68 in contact with conductive pad $48_1$ through an opening 70 provided in insulating layer 66;
  a conductive pad 72 in contact with conductive pad $46_6$ through an opening 74 provided in insulating layer 66; and a conductive pad 76 extending on insulating layer 66 opposite general light-emitting diodes $D_2$ to $D_5$ and playing the role of a thermal pad.

Figure 10:
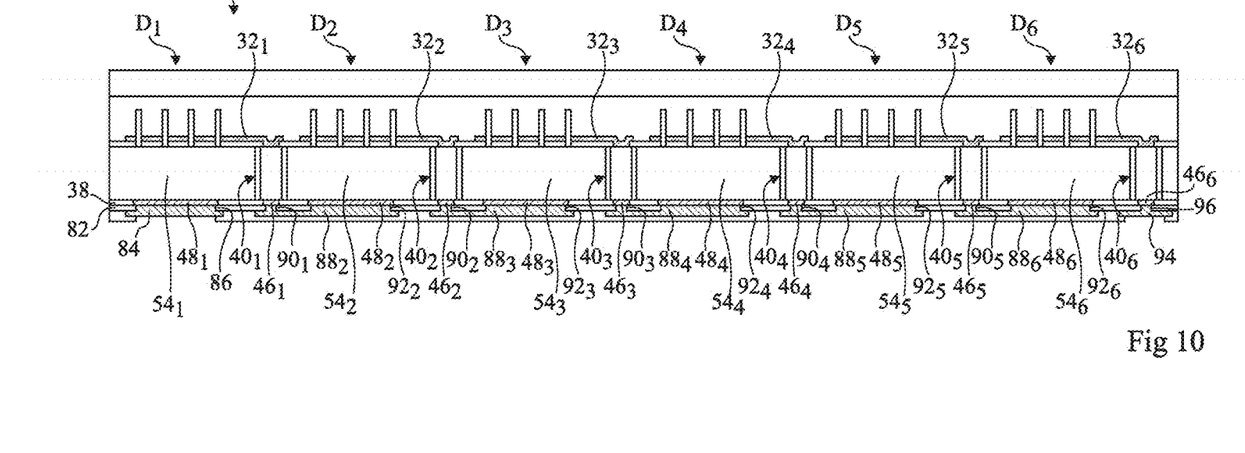

FIG. 10 is a view similar to FIG. 9 of an embodiment of an optoelectronic device 80 comprising a succession of a plurality of series-connected general light-emitting diodes $D_1$ to $D_6$. Optoelectronic device 80 is obtained by reproducing a plurality of times the structure shown in one of FIG. 1, 7, or 8 with the difference that conductive portion 51 is not present. As compared with the structures shown in one of FIG. 1, 7, or 8, optoelectronic device 80 further comprises:

an additional insulating layer 82 covering insulating layer 38;

a conductive pad 84 in contact with conductive pad $48_1$ through an opening 86 provided in insulating layer 82;

conductive pads $88_i$, with i varying from 2 to 5, each conductive pad $88_i$ being in contact with conductive pad $46_{i-1}$ through an opening $90_{i-1}$ provided in insulating layer 82 and in contact with conductive pad $48_i$ through an opening $92_i$ provided in insulating layer 82;

a conductive pad 94 in contact with conductive pad $46_6$ through an opening 96 provided in insulating layer 82; and an insulating layer 98 covering insulating layer 82, totally covering conductive pads $88_i$, where i varies from 2 to 5, and partially covering conductive pads 84 and 94.

FIGS. 11A to 11D are partial simplified cross-section views of structures obtained at successive steps of another embodiment of a method of manufacturing optoelectronic device 5 shown in FIG. 1, only two wires being shown for each general light-emitting diode.

Figure 11A:
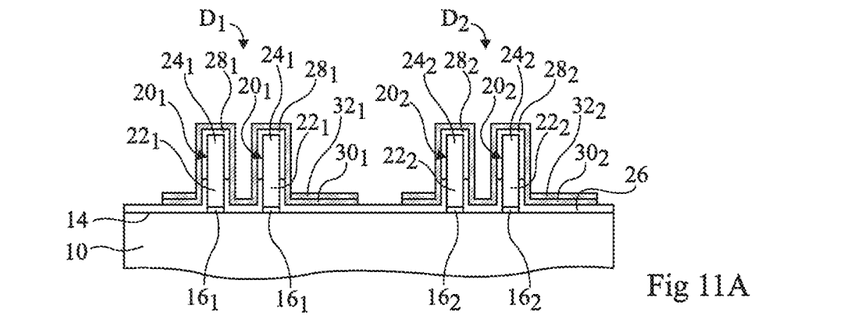
FIGS. 11A to 11D are partial simplified cross-section views of structures obtained at successive steps of an embodiment of a method of manufacturing the optoelectronic device comprising microwires or nanowires shown in FIG. 1.

An embodiment of a manufacturing method providing the structure shown in FIG. 11A comprises the steps of:

(1) Forming, on surface 14 of substrate 10, seed pads $16_1$, $16_2$.

Seed pads 16 may be obtained by depositing a seed layer on surface 14 and by etching portions of the seed layer all the way to surface 12 of substrate 10 to delimit the seed pads.

The seed layer may be deposited by a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), hydride vapor phase epitaxy (HVPE) may be used, as well as an atomic layer deposition (ALD). Further, methods such as evaporation or reactive cathode sputtering may be used.

When seed pads $16_1$, $16_2$ are made of aluminum nitride, they may be substantially textured and have a preferred polarity. The texturing of pads $16_1$, $16_2$ may be obtained by an additional treatment performed after the deposition of the seed layer. It for example is an anneal under an ammonia flow ($NH_3$).

(2) Protecting the portions of surface 14 of substrate 10 which are not covered with seed pads $16_1$, $16_2$ to avoid the subsequent growth of wires on these portions. This may be obtained by a nitriding step which causes the forming, at the surface of substrate 10, between seed pads $16_1$, $16_2$, of silicon nitride regions (for example, SiN or $Si_3N_4$). This may also be obtained by a step of masking substrate 10 between seed pads $16_1$, $16_2$, including the deposition of a layer, for example of a $SiO_2$ or SiN or $Si_3N_4$ dielectric, followed by the etching of this layer outside of seed pads $16_1$, $16_2$ after a photolithography step. In this case, the masking layer may extend over seed pads $16_1$, $16_2$. When the protection step (2) is carried out by a step of masking substrate 10, the seed layer etch step may be avoided. Seed pads $16_1$, $16_2$ are then formed of a uniform continuous layer having its surface left free at the level where the wires cross.

(3) Growing lower portion $22_1$, $22_2$ of each wire $20_1$, $20_2$ up to height $H_2$. Each wire $20_1$, $20_2$ grows from the top of the underlying seed pad $16_1$, $16_2$.

Wires $20_1$, $20_2$ may be grown by a process of CVD, MOCVD, MBE, GSMBE, PAMBE, ALE, HVPE, ALD type. Further, electrochemical processes may be used, for example, chemical bath deposition (CBD), hydrothermal processes, liquid aerosol pyrolysis, or electrodeposition.

As an example, the wire growth method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia ($NH_3$), tertiarybutylphosphine (TBP), arsine ($AsH_3$), or unsymmetrical dimethylhydrazine (UDMH).

According to an embodiment of the invention, in a first phase of growth of the wires of the III-V compound, a precursor of an additional element is added in excess, in addition to the precursors of the III-V compound. The additional element may be silicon (Si). An example of a precursor of silicon is silane ($SiH_4$).

As an example, in the case where upper portion $22_1$, $22_2$ is made of heavily-doped N-type GaN, a MOCVD-type method may be implemented by injection, into a showerhead-type MOCVD reactor, of a gallium precursor gas, for example, trimethylgallium (TMGa) and a nitrogen precursor gas, for example, ammonia ($NH_3$). As an example, a showerhead-type 3×2" MOCVD reactor commercialized by AIXTRON, may be used. A molecular flow ratio between trimethylgallium and ammonia within the 5-200 range, preferably within the 10-100 range, enables to favor the growth of wires. As an example, a carrier gas which ensures the diffusion of metal-organic elements all the way into the reactor charges with metal-organic elements in a TMGa bubbler. The latter is adjusted according to the standard operating conditions. A flow of 60 sccm (standard cubic centimeters per minute) is for example selected for TMGa, while a 300-sccm flow is used for $NH_3$ (standard $NH_3$ bottle). A pressure of approximately 800 mbar (800 hPa) is used. The gaseous mixture further comprises silane injected into the MOCVD reactor, which material is a precursor of silicon. The silane may be diluted in hydrogen at 1,000 ppm and a 20-sccm flow is provided. The temperature in the reactor is for example in the range from 950° C. to 1,100° C., preferably from 990° C. to 1,060° C. To transport species from the outlet of the bubblers to the two reactor plenums, a 2,000-sccm flow of carrier gas, for example, $N_2$, distributed between the two plenums, is used. The previously-indicated gas flows are given as an indication and should be adapted according to the size and to the specificities of the reactor.

The presence of silane among the precursor gases results in an incorporation of silicon within the GaN compound. A lower N-type doped portion $22_1$, $22_2$ is thus obtained. This further translates as the forming of a silicon nitride layer, not shown, which covers the periphery of portion $22_1$, $22_2$ of height $H_2$, except for the top, as portion $22_1$, $22_2$ grows.

(4) Growing upper portion $24_1$, $24_2$ of height $H_3$ of each wire $20_1$, $20_2$ on the top of lower portion $22_1$, $22_2$. For the growth of upper portion $24_1$, $24_2$, the previously-described operating conditions of the MOCVD reactor are, as an example, maintained but for the fact that the silane flow in the reactor is decreased, for example, by a factor greater than or equal to 10, or stopped. Even when the silane flow is stopped, upper portion $24_1$, $24_2$ may be N-type doped due to the diffusion in this active portion of dopants originating from the adjacent passivated portions or due to the residual doping of GaN.

(5) Forming by epitaxy, for each wire $20_1$, $20_2$, the layers forming shell $28_1$, $28_2$. Given the presence of the silicon nitride layer covering the periphery of lower portion $22_1$, $22_2$, the deposition of the layers forming shell $28_1$, $28_2$ only occurs on upper portion $24_1$, $24_2$ of wire $20_1$, $20_2$.

(6) Forming insulating layer 26, for example, by conformally depositing an insulating layer over the entire structure obtained at step (5) and etching this layer to expose shell $28_1$, $28_2$ of each wire $20_1$, $20_2$. In the previously-described embodiment, insulating layer 26 does not cover shell $28_1$, $28_2$. As a variation, insulating layer 26 may cover a portion of shell $28_1$, $28_2$. Further, insulating layer 26 may be formed before shell $28_1$, $28_2$.

(7) Forming each electrode $30_1$, $30_2$, for example, by conformal deposition and etching.

(8) Forming each conductive layer $32_1$, $32_2$ for example by physical vapor deposition (PVD) over the entire structure obtained at step (7) and etching of this layer to expose each wire $20_1$, $20_2$.

In the previously-described embodiment, insulating layer 26 covers the entire periphery of lower portion $22_1$, $22_2$ of each wire $20_1$, $20_2$. As a variation, it is possible for a portion of lower portion $22_1$, $22_2$, or even the entire lower portion $22_1$, $22_2$, not to be covered with insulating layer 26. It is possible for layer 26 not to cover the lower portion $22_1$, $22_2$ of each wire $20_1$, $20_2$. In this case, shell $28_1$, $28_2$ may cover each wire 20 up to a height greater than $H_3$, or even up to height $H_1$.

In the previously-described embodiment, insulating layer 26 does not cover the periphery of upper portion $24_1$, $24_2$ of each wire $20_1$, $20_2$. As a variation insulating layer 26 may cover a portion of upper portion $24_1$, $24_2$ of each wire $20_1$, $20_2$.

According to another variation, insulating layer 26 may, for each wire $20_1$, $20_2$, partially cover the lower portion of shell $28_1$, $28_2$.

According to a variation of the previously-described manufacturing method, the layers forming shell $28_1$, $28_2$ may be formed before insulating layer 26 over the entire wire $20_1$, $20_2$ or only over a portion of wire $20_1$, $20_2$, for example, upper portion $24_1$, $24_2$.

Figure 11B:
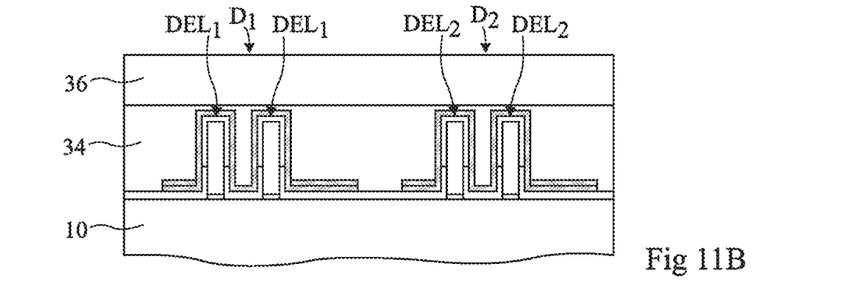

FIG. 11B shows the structure obtained after the steps of:
depositing an encapsulation layer 34 over the entire plate 10; and
bonding handle 36 to encapsulation layer 34.

When encapsulation layer 34 is made of an inorganic material, this material may then be deposited by low-temperature CVD, particularly at a temperature lower than 300° C.-400° C., for example by PECVD (plasma enhanced chemical vapor deposition).

When encapsulation layer 34 is made of an organic material, encapsulation layer 34 may be deposited by a spin coating deposition method, by an inkjet printing method, or by a silk-screening method. A method of dispensing by time/pressure feeder or by volumetric feeder is also possible in automated mode on programmable equipment.

According to an embodiment, handle 36 is intended to be kept on the final optoelectronic device. Handle 36 then is made of an at least partly transparent material. According to another embodiment, handle 36 is intended to be removed at a subsequent step of the manufacturing method. In this case, handle 36 may be made of any type material compatible with the subsequent steps of the manufacturing method. It may be silicon or any planar substrate compatible with microelectronics flatness criteria.

Handle 36 may be attached to encapsulation layer 34 by any means, for example, by bonding, by using a layer of temperature crosslinkable organic glue, not shown, or also by molecular bonding (direct bonding) or optical bonding by glue hardened by ultra-violet radiation. When encapsulation layer 34 is made of an organic material, this material may be used as glue for handle 36.

The method may further comprise a step of forming a phosphor layer, for example between encapsulation layer 34 and handle 36. Encapsulation layer 34 may itself be partly made of phosphors.

Figure 11C:
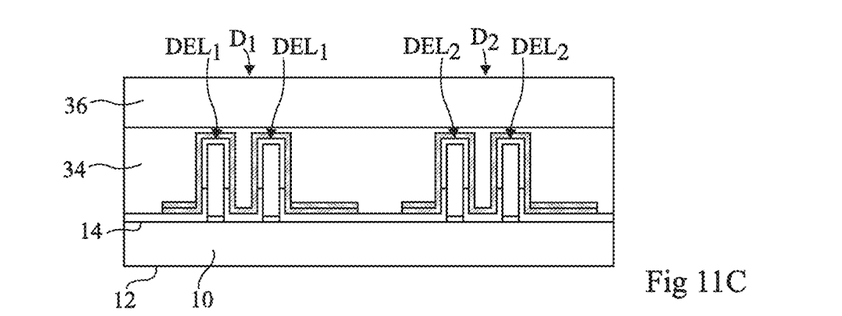

FIG. 11C shows the structure obtained after a step of thinning substrate 10. After thinning, the thickness of substrate 10 may be in the range from 20 µm to 200 µm, for example, approximately 30 µm. The thinning step may be carried out by one or more than one milling or etching step, and/or by chemical mechanical polishing methods (CMP).

Thinned substrate 10 comprises surface 12 opposite to surface 14. Surfaces 12 and 14 are preferably parallel.

Figure 11D:
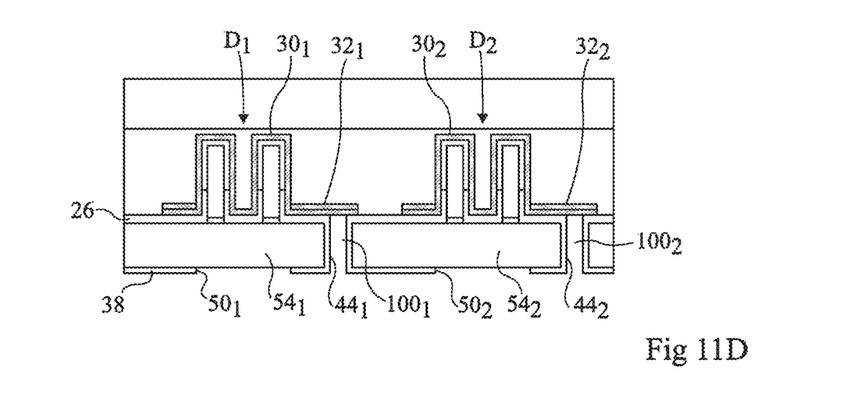

FIG. 11D shows the structure obtained after the steps of:
forming insulating layer 38, for example, made of silicon oxide ($SiO_2$) or of silicon oxynitride (SiON), on rear surface 12 of substrate 10. Insulating layer 38 is for example carried out by conformal deposition by PECVD. Insulating layer 38 has a thickness in the range from 100 nm to 5,000 nm, for example, approximately 1 µm;
etching, for each general light-emitting diode $D_1$, $D_2$, at least one opening $100_1$, $100_2$ crossing insulating layer 38, substrate 10, insulating layer 26 to expose an electrode layer $30_1$, $30_2$. Preferably, electrode layer $30_1$, $30_2$ is also etched to expose a portion of metal layer $32_1$, $32_2$. The etching of substrate 10 may be a deep reactive ion etching (DRIE). The etching of the portion of insulating layer 26 is also performed by plasma etching with the chemistry adapted to insulating layer 26. At the same time, electrode layer $30_1$, $30_2$ may be etched. As a variation, layer $30_1$, $30_2$ may be removed from the areas where TSVs are formed before the step of forming metal layer $32_1$, $32_2$. Opening $100_1$, $100_2$ may have a circular or rectangular cross-section;
forming insulating layer $44_1$, $44_2$, for example, made of $SiO_2$ or SiON on layer 38 and on the internal walls of opening $100_1$, $100_2$. Insulating layer $44_1$, $44_2$ is for example, formed by conformal PECVD. Insulating layer $100_1$, $100_2$ has a thickness in the range from 200 nm to 5,000 nm, for example, approximately 3 µm. In the case where insulating trenches 56 are provided, as shown in FIGS. 5 and 6, insulating layer $44_1$, $44_2$ may be formed at the same time as trenches 56;
etching insulating layer $44_1$, $44_2$ to expose conductive layer $32_1$, $32_2$ at the bottom of opening $100_1$, $100_2$. It is an anisotropic etching; and
etching at least one opening $50_1$, $50_2$ in insulating layer 38, $44_1$, $44_2$ to expose a portion of surface 12 of substrate 10. To perform this etching, opening $100_1$, $100_2$ may be temporarily obstructed, for example, with resin.

The following steps enabling to obtain the structure shown in FIG. 1 comprise forming conductive pads $48_1$, $48_2$ in openings $50_1$, $50_2$ and conductive layer $42_1$, $42_2$ on insulating layer $44_1$, $44_2$, conductive layer $42_1$, $42_2$ covering the internal walls of openings $100_1$, $100_2$ to come into contact with metal portion $32_1$, $32_2$ and extending on surface 12 around opening $100_1$, $100_2$ to form conductive pad $46_1$, $46_2$.

Conductive pads $46_1$, $46_2$, $48_1$, $48_2$ and conductive layer $42_1$, $42_2$ may comprise a stack of two or more than two layers. It for example is TiCu or TiAl. This layer may be covered with another metal layer, for example, gold, copper, or eutectic alloys (Ni/Au or Sn/Ag/Cu) to implement a soldering method. Conductive pads $46_1$, $46_2$, $48_1$, $48_2$ and conductive layer $42_1$, $42_2$ may be formed, particularly in the case of copper, by electrochemical deposition (ECD). The thickness of conductive pads $46_1$, $46_2$, $48_1$, $48_2$ and conductive layer $42_1$, $42_2$ may be in the range from 1 µm to 10 µm, for example, approximately 5 µm.

Figure 12A:
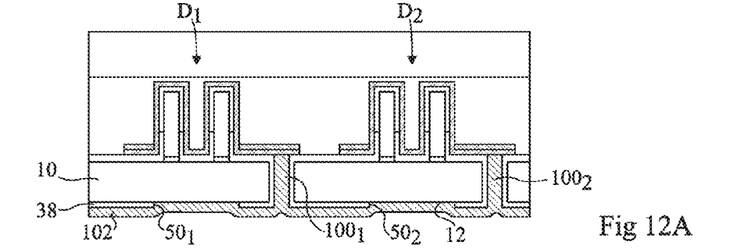
FIGS. 12A to 12C are partial simplified cross-section views of structures obtained at successive steps of another embodiment of a method of manufacturing the optoelectronic device comprising microwires or nanowires shown in FIG. 7.
Figure 12B:
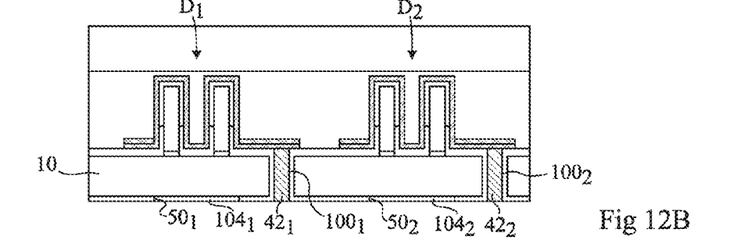
Figure 12C:
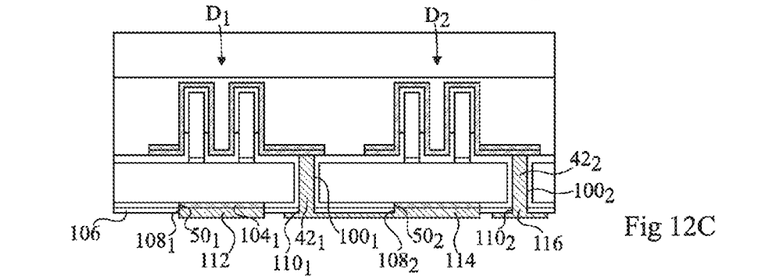

FIGS. 12A to 12C are partial simplified cross-section views of structures obtained at successive steps of another embodiment of a method of manufacturing optoelectronic device 57 shown in FIG. 7 and comprises all the steps described in relation with FIGS. 11A to 11D.

FIG. 12A shows the structure obtained after a deposition, on the side of rear surface 12, of a thick metal layer 102, for example, copper. It may be an ECD. The thickness of insulating layer 102 is for example in the order of 10 µm. Metal layer 102 is sufficiently thick to fill opening $100_1$, $100_2$.

FIG. 12B shows the structure obtained after a step of polishing metal layer 102 to delimit a metal portion $104_1$, $104_2$ in each opening $50_1$, $50_2$ and conductive portion $42_1$, $42_2$ in opening $100_1$, $100_2$. The step of planarizing layer 102 may be carried out by CMP.

FIG. 12C shows the structure obtained after carrying out the steps of:
depositing an insulating layer 106 over the entire rear surface of substrate 10;
forming in insulating layer 106 an opening $108_1$, $108_2$ continuing opening $50_1$, $50_2$ and an opening $110_1$, $110_2$ continuing openings $100_1$, $100_2$; and
forming a conductive portion 112 in opening $108_1$ in contact with metal portion $104_1$, forming a conductive portion 114 in contact with conductive portion $42_1$ through opening $110_1$ and conductive portion $104_2$ through opening $108_2$, and forming a conductive portion 116 in opening $110_2$ in contact with conductive portion $42_2$.

Figure 13A:
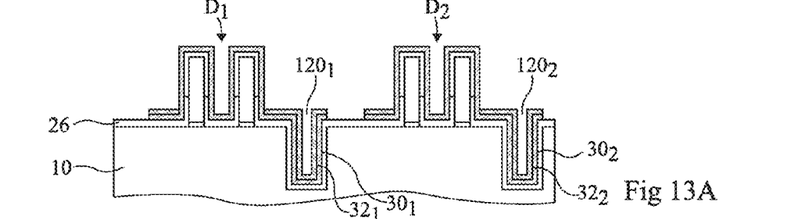
FIGS. 13A and 13B are partial simplified cross-section views of structures obtained at successive steps of another embodiment of a method of manufacturing an optoelectronic device comprising microwires or nanowires.
Figure 13B:
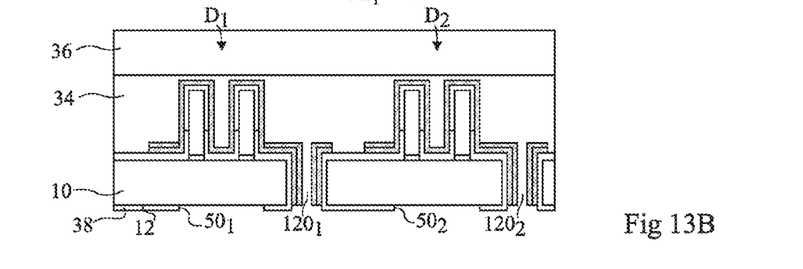

FIGS. 13A and 13B are partial simplified cross-section views of structures obtained at successive steps of another embodiment of an optoelectronic device having a structure close to that of optoelectronic device 5 shown in FIG. 1.

The initial steps may comprise the steps previously described in relation with FIG. 11A, with the difference that, before steps (5) to (8), an opening $120_1$, $120_2$ is formed in substrate 10 for each general light-emitting diode $D_1$, $D_2$. Opening $120_1$, $120_2$ may be formed by a DRIE-type etching. The depth of opening $120_1$, $120_2$ is strictly greater than the thickness of substrate 10 after the thinning step. As an example, the depth of opening $120_1$, $120_2$ is in the range from 10 µm to 200 µm, for example, in the order of 35 µm.

During the implementation of steps (5) to (8), insulating layer 26, electrode $30_1$, $30_2$, and conductive layer $32_1$, $32_2$ are also formed in opening $120_1$, $120_2$.

FIG. 13B shows the structure obtained after having carried out the steps of:
depositing encapsulation layer 34 similarly to what has been previously described in relation with FIG. 11B. Encapsulation layer 34 partially or totally penetrates into opening $120_1$, $120_2$;
installing handle 36 similarly to what has been previously described in relation with FIG. 11B;
thinning substrate 10 similarly to what has been previously described in relation with FIG. 11C all the way to opening $120_1$, $120_2$;
forming insulating layer 38 on rear surface 12 of substrate 10 by protecting opening 120; and
forming openings $50_1$, $50_2$ in insulating layer 38 to expose a portion of substrate 10.

The subsequent steps of the method may be similar to what has been previously described.

Figure 14A:
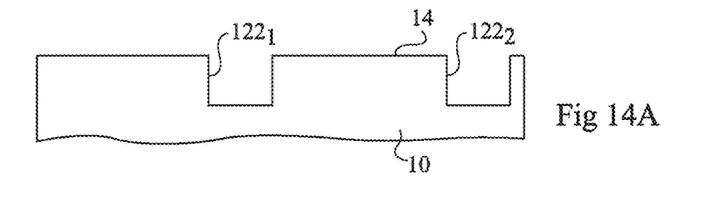
FIGS. 14A to 14E are partial simplified cross-section views of structures obtained at successive steps of another embodiment of a method of manufacturing the optoelectronic device comprising microwires or nanowires shown in FIG. 8.
Figure 14B:
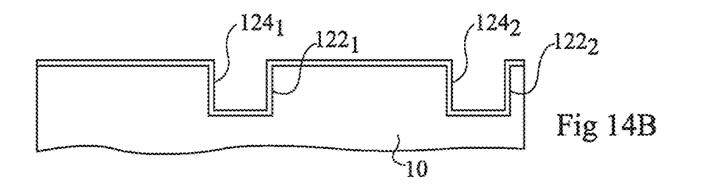
Figure 14C:
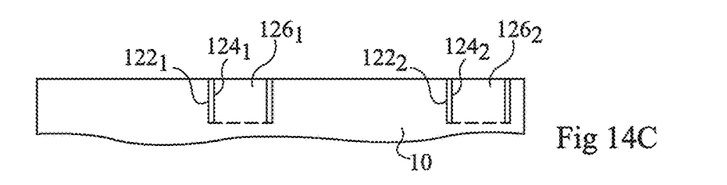

FIGS. 14A to 14E are partial simplified cross-section views of structures obtained at successive steps of an embodiment of a method of manufacturing optoelectronic device 60 shown in FIG. 8. FIGS. 14A to 14C show structures obtained after having carried out steps before step (1) previously described in relation with FIG. 11A.

FIG. 14A shows the structure obtained after having etched, for each general light-emitting diode $D_1$, $D_2$, an opening $122_1$, $122_2$ in substrate 10. Opening $122_1$, $122_2$ may be formed by an etching of reactive ion etching type, for example, a DRIE. The depth of opening $122_1$, $122_2$ is strictly greater than the targeted thickness of substrate 10 after the thinning step. As an example, the depth of opening $122_1$, $122_2$ is in the range from 10 µm to 200 µm, for example, approximately 35 µm. The distance between the lateral walls of opening $122_1$, $122_2$ is in the range from 1 to 10 µm and for example 2 µm. The distance separating opening $122_1$ of general light-emitting diode $D_1$ from opening $122_2$ of general light-emitting diode $D_2$ is in the range from 100 µm to 3,000 µm.

FIG. 14B shows the structure obtained after the forming of an insulating portion $124_1$, $124_2$, for example, made of silicon oxide, on the lateral walls of each opening $122_1$, $122_2$, for example, by a thermal oxidation method. At this step, an insulating portion may also form at the bottom of opening $122_1$, $122_2$ and on the rest of substrate 10. The thickness of insulating portion may be in the range from 100 nm to 3,000 nm, for example, approximately 200 nm.

FIG. 14C shows the structure obtained after having carried out the steps of:
anisotropically etching the insulating portion at the bottom of opening $122_1$, $122_2$ and the insulating portion covering surface 14 of substrate 10, to keep insulating portions $124_1$, $124_2$ on the lateral sides of opening $122_1$, $122_2$. As an example, the etching of the insulating portion covering surface 14 of substrate 10 may be omitted. In this case, a mask formed by photolithography may be provided to protect said unetched insulating portions;
filling each opening $122_1$, $122_2$ with a filling material, for example, undoped polysilicon, for example deposited by LPCVD. Polysilicon advantageously has a thermal expansion coefficient close to that of silicon and thus enables to decrease the mechanical stress during the previously-described steps carried out at high temperatures, particularly in relation with steps 11A to 11C; and
removing the layer of filling material, for example, by a CMP-type method. In the case where the etching of the insulating portion covering surface 14 of substrate 10 has been omitted during the anisotropic etching of the insulating portion at the bottom of opening $122_1$, $122_2$, said unetched layer may advantageously be used as a stop layer during the removal of the layer of filling material. In this case, the removal of the layer of filling material is followed by a step of etching the insulating portion covering surface 14 of substrate 10.

For each light-emitting diode $D_1$, $D_2$, a portion $126_1$, $126_2$ of the filling material is thus obtained.

Figure 14D:
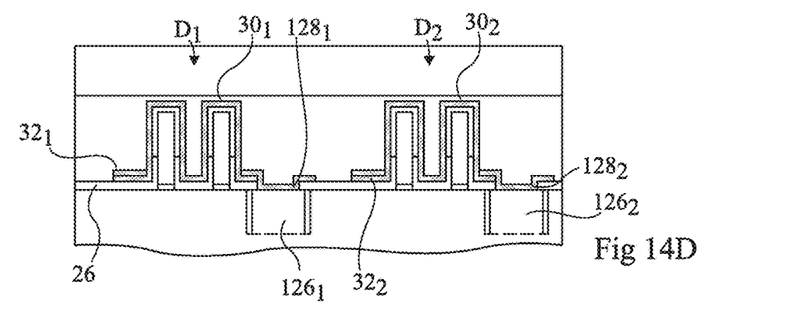

FIG. 14D shows the structure obtained after the implementation of steps similar to what has been previously described in relation with FIGS. 11A to 11C, with the difference that it comprises, before the forming of conductive layer $32_1$, $32_2$, a step of etching an opening $128_1$, $128_2$ in electrode layer $30_1$, $30_2$ and of insulating layer 26 so that conductive layer $32_1$, $32_2$ comes into contact with portion $126_1$, $126_2$.

Figure 14E:
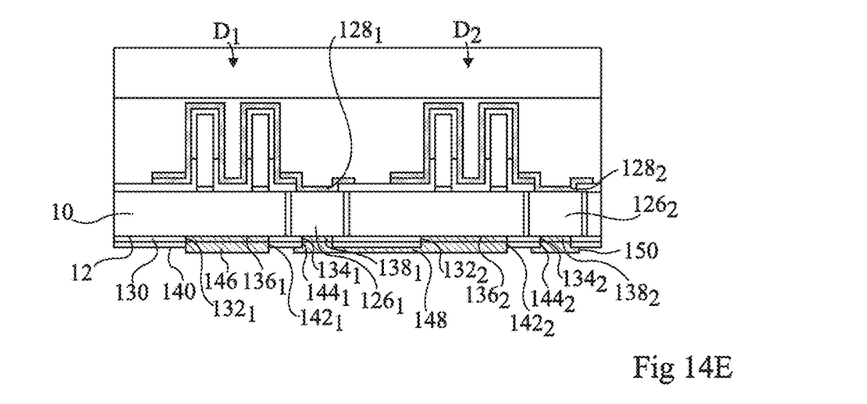

FIG. 14E shows the structure obtained after implementation of the following steps, similarly to what has been previously described in relation with FIGS. 12A to 12C:

thinning substrate 10 to reach conductive portion $126_1$, $126_2$;

forming an insulating layer 130 on rear surface 12 of substrate 10;

forming, in insulating layer 130, for each general light-emitting diode $D_1$, $D_2$, an opening $132_1$, $132_2$ to expose a portion of rear surface 12 of substrate 10 and an opening $134_1$, $134_2$ to expose conductive portion $126_1$, $126_2$;

forming a conductive pad $136_1$, $136_2$ in opening $132_1$, $132_2$ in contact with substrate 10 and a conductive pad $138_1$, $138_2$ in opening $134_1$, $134_2$ in contact with conductive portion $126_1$, $126_2$;

depositing an insulating layer 140 covering insulating layer 130 and conductive pads $136_1$, $136_2$, $138_1$, $138_2$;

forming in insulating layer 140 an opening $142_1$, $142_2$ continuing opening $132_1$, $132_2$ and an opening $144_1$, $144_2$ continuing openings $134_1$, $134_2$;

forming a conductive portion 146 in opening $142_1$ in contact with metal portion $136_1$, forming a conductive portion 148 in contact with conductive portion $138_1$ through opening $144_1$ and with conductive portion $142_2$ through opening $142_1$, and forming a conductive portion 150 in opening $144_2$ in contact with conductive portion $42_2$.

As a variation, insulating layer 130 may be absent and conductive pads $136_1$, $136_2$, $138_1$, $138_2$ may be directly formed on substrate 10.

According to another variation, instead of delimiting a portion $126_1$, $126_2$ of substrate 10 with insulating trenches, the method may comprise the following steps instead of the steps previously-described in relation with FIG. 14A:

etching an opening in substrate 10 substantially at the dimensions of portion $126_1$, $126_2$;

forming an insulating portion, for example, made of silicon oxide, on the lateral walls of the opening, for example, by a thermal oxidation method. At this step, an insulating portion may also form at the bottom of the opening and on the rest of substrate 10; and filling the opening with a conductive material, for example, doped polysilicon, tungsten, or a refractory material which withstands the temperatures present at the subsequent steps of the manufacturing method.

Specific embodiments of the present invention have been described. Various alterations and modifications will occur to those skilled in the art. Further, although, in the previously-described embodiments, each wire $20_1$, $20_2$ comprises a passivated portion $22_1$, $22_2$ at the base of the wire in contact with one of seed pads $16_1$, $16_2$, passivated portion $22_1$, $22_2$ may be absent.

Further, although embodiments have been described for an optoelectronic device for which shell $28_1$, $28_2$ covers the top of the associated wire $20_1$, $20_2$ and part of the lateral sides of wire $20_1$, $20_2$, it is possible to only provide the shell at the top of wire $20_1$, $20_2$.

The invention claimed is:

1. An optoelectronic device comprising:
   a substrate, wherein the substrate is a doped semiconductor substrate of a first conductivity type, the substrate comprising a first surface and a second surface opposite the first surface;
   a first assembly of first light-emitting diodes supported by a first portion of the substrate and comprising first wire-shaped, conical, or frustoconical semiconductor elements;
   a first electrode, at least partially transparent, covering each first light-emitting diode;
   a first insulated conductive portion insulated from the substrate and crossing the substrate from the second surface to at least the first surface and connected to the first electrode;
   a second assembly of second light-emitting diodes supported by a second portion of the substrate and comprising second wire-shaped, conical, or frustoconical semiconductor elements;
   a second electrode, at least partially transparent, covering each second light-emitting diode;
   a second insulated conductive portion insulated from the substrate and crossing the substrate from the second surface to at least the first surface and connected to the second electrode; and
   a first conductive element, electrically connecting on the second surface side the first insulated conductive portion to the second substrate portion, wherein the first assembly of first light-emitting diodes is connected in series with the second assembly of second light-emitting diodes.

2. The optoelectronic device of claim 1, wherein the first portion of the substrate is insulated from the second portion of the substrate by the first insulated conductive portion.

3. The optoelectronic device of claim 2, comprising a first lateral edge and a second lateral edge opposite the first lateral edge and wherein the first insulated conductive portion extends from the first to the second lateral edge.

4. The optoelectronic device of claim 2, wherein the first insulated conductive portion surrounds the first substrate portion.

5. The optoelectronic device of claim 1, comprising an insulating portion, different from the first insulated conductive portion and insulating the first portion of the substrate from the second portion of the substrate.

6. The optoelectronic device of claim 5, comprising a first lateral edge and a second lateral edge opposite the first lateral edge and wherein the insulating portion extends from the first lateral edge to the second lateral edge.

7. The optoelectronic device of claim 5, wherein the insulating portion surrounds the first portion of the substrate.

8. The optoelectronic device of claim 1, comprising a first conductive pad on the second surface in contact with the first portion of the substrate.

9. The optoelectronic device of claim 1, wherein the substrate is selected from the group comprising silicon, germanium, silicon carbide, and III-V compounds.

10. The optoelectronic device of claim 1, wherein the dopant concentration of the substrate is in the range from $5*10^{16}$ to $2*10^{20}$ atoms/cm$^3$.

11. The optoelectronic device of claim 1, wherein the light-emitting diodes of the first assembly are capable of emitting light at a first wavelength and wherein the light-emitting diodes of the second assembly are capable of emitting light at a second wavelength different from the first wavelength.

12. The optoelectronic device of claim 1, further comprising:
- a third assembly of third light-emitting diodes supported by a third portion of the substrate and comprising third wire-shaped, conical, or frustoconical semiconductor elements;
- a third electrode, at least partially transparent, covering each third light-emitting diode;
- a third conductive portion insulated from the substrate and crossing the substrate from the second surface to at least the first surface and connected to the third electrode; and
- a second conductive element, connecting on the second surface side the second conductive portion of the third portion of the substrate.

13. The optoelectronic device of claim 12, wherein the light-emitting diodes of the third assembly are capable of emitting light at a third wavelength different from the first and second wavelengths.

14. The optoelectronic device of claim 13, wherein the surfaces of the first, second, and third assemblies are selected so that the composition of the light at the first, second, and third emitted wavelengths corresponds to an emitted white light.

15. The optoelectronic device of claim 13, wherein one of the first, second, or third wavelengths corresponds to blue light, another one of the first, second, or third wavelengths corresponds to green light, and another one of the first, second, or third wavelengths corresponds to red light.

16. The optoelectronic device of claim 1, comprising from four to more than one hundred assemblies of light-emitting diodes series-connected by conductive portions insulated from the substrate and crossing the substrate from the second surface to at least the first surface.

* * * * *